Jan. 23, 1968 A. F. PETRIE 3,365,545

NETWORK TO COUPLE A LOAD TO A TRANSISTORIZED AMPLIFIER

Filed Dec. 29, 1964

INVENTOR.
ADELORE F. PETRIE

BY Thomas A. Briody
ATTORNEY.

United States Patent Office 3,365,545
Patented Jan. 23, 1968

3,365,545
NETWORK TO COUPLE A LOAD TO A TRANSISTORIZED AMPLIFIER

Adelore F. Petrie, Decatur, Ill., assignor to General Electric Company, a corporation of New York Filed Dec. 29, 1964, Ser. No. 421,973
5 Claims. (Cl. 179—1)

This invention generally relates to an improved amplifier system wherein a load device is coupled to an amplifier which incorporates two semi-conductive devices connected in series. More specifically, it relates to a coupling network for connecting a load device to such an amplifier.

An important object of my invention is to provide an improved amplifier system which incorporates a simplified direct coupling network.

Another object of this invention is to provide an improved direct coupling network which reduces the number of components therein.

Another object of this invention is to provide a direct coupling network which includes a single capacitor.

Briefly stated, this invention in one form thereof provides a direct coupling network wherein most of an AC output signal is coupled to a load device while substantially all of a DC signal and a portion of the AC output signal are fed back to different stages of the system. This network requires only one capacitor between the load device and the amplifier as contrasted with the prior art wherein at least two capacitors were necessary.

The novel features which are characteristic of this invention are set forth with particularity in the appended claims. The invention itself, however, both as to its organization and method of operation, together with further objects and advantages thereof, may be understood best by reference to the following description of one form of the amplifier taken in connection with the accompanying drawings.

Although the paritcular amplifier shown utilizes a pair of transistors having complementary symmetry, the invention can be easily adapted to any amplifier which uses series-connected transistors, without departing from the scope of the invention, as discussed hereinafter. Since both FIGURES 1 and 2 illustrate similar amplifiers, like numbers are used to identify like components.

Figure 1:
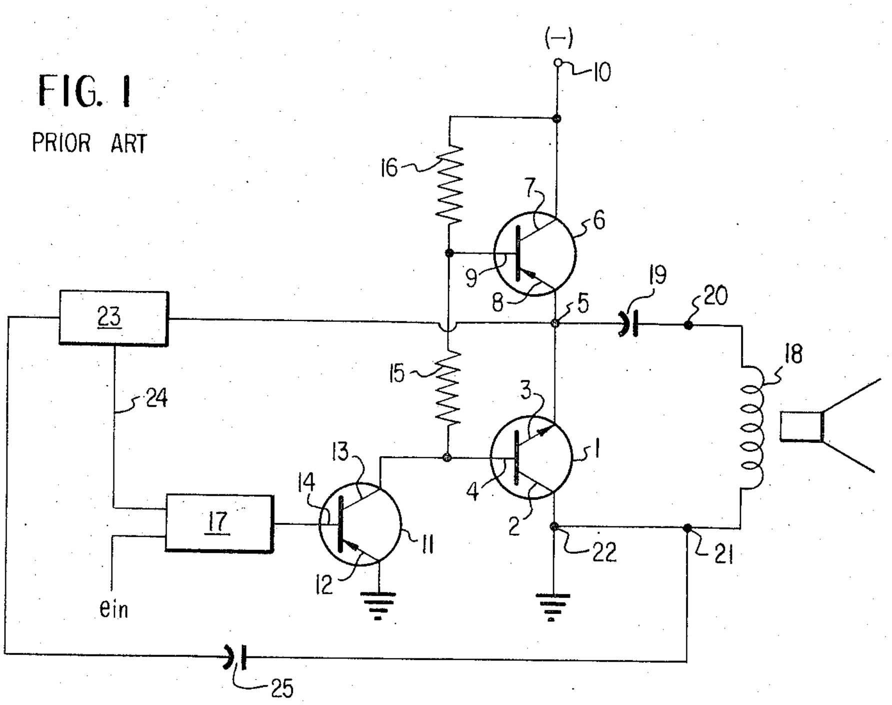
FIG. 1 PRIOR ART
FIGURE 1 illustrates a coupling network which is indicative of the prior art and which is connected between the amplifier and the load device.
Figure 2:
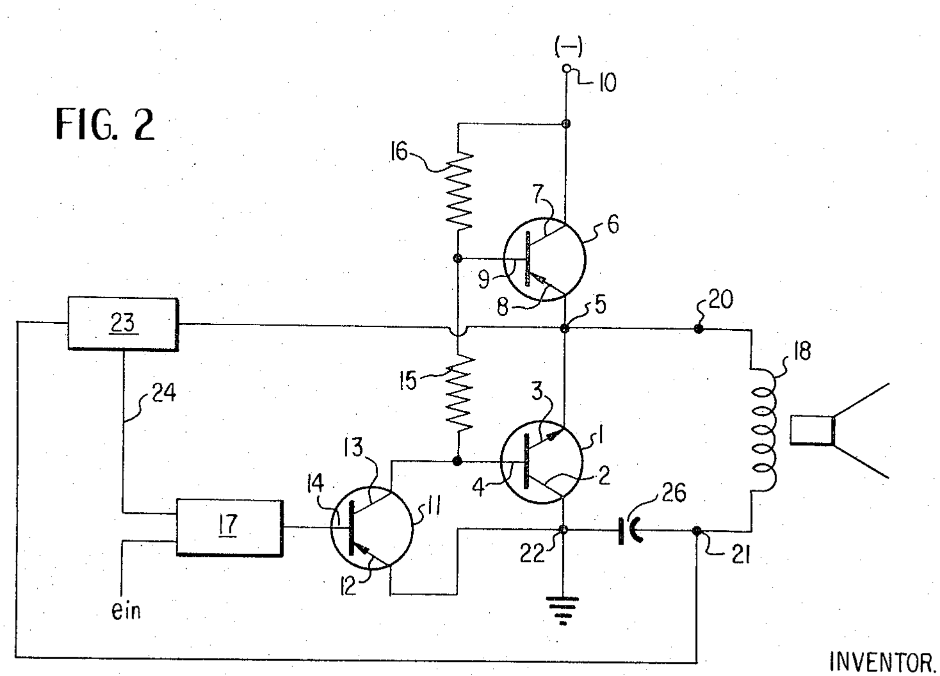
FIGURE 2 illustrates an improved coupling network between the amplifier and the load device, in accordance with one form of my invention.

Referring to FIGURE 1, an amplifier is illustrated with which the invention may be advantageously employed. This amplifier produces an output which is free from second harmonics, in a manner similar to that of a push-pull amplifier. A first transistor 1 of the NPN type has its collector 2 grounded and its emitter 3 connected to an electrode junction 5, while its base 4 is connected in a manner described hereinafter. A second transistor 6 of the PNP type has its collector 7 connected to a source of negative potential 10 and its emitter 8 connected to the electrode junction 5, while its base 9 is connected in a manner described hereinafter. A third transistor 11 of the PNP type, which operates as a class A amplifier-driver, has its emitter 12 grounded and its collector 13 connected to the source of negative potential 10 through series resistors 15 and 16, while its base 14 is driven by an input signal, $e_{in}$, after the input signal is amplified by a network designated as 17. The base 4 of the transistor 1 is connected to a junction formed by the collector 13 and the resistor 15; and the base 9 of the transistor 6 is connected to a junction formed by the resistor 15 and the resistor 16.

In the prior art amplifier illustrated in FIGURE 1, a coupling capacitor 19 is connected between the electrode junction 5 and an output terminal 20, thereby blocking a DC path to ground through a load device, such as a speaker 18. The speaker 18 is connected between the output terminal 20 and an output terminal 21, and the output terminal 21 is connected to a ground junction 22. The coupling capacitor 19 is chosen so as to provide the desired signal coupling between the electrode junction 5 and the speaker 18. A feedback network 23, comprising a voltage divider circuit as known in the art, and an AC bypass capacitor 25 are also connected between the electrode junction 5 and the grounded output terminal 21. A connection 24 between the feedback network 23 and the network 17 supplies DC feedback to the network 17, as well as a portion of AC output signal.

During a positive half-cycle, the input signal, $e_{in}$, drives the base 14 in a positive direction. As the collector current in the transistor 11 decreases, the voltage on both the transistor base 4 and the transistor base 9 moves in a negative direction. Impressing this negative signal on the bases 4 and 9 turn off the transistor 1 and turns on the transistor 6. During the opposite half-cycle of the input signal, the transistor base 14 is driven in a negative direction; and the bases 4 and 9 are driven positively. As these bases are driven positively, the transistor 1 turns on while the transistor 6 turns off. Positive half-cycles of the input signal are thereby amplified by the transistor 6 while the transistor 1 amplifies the negative half-cycles. Both the transistor 1 and the transistor 6 are used as emitter followers and provide equal voltage gains. With the coupling network and load connected as described above, the majority of the AC signal is coupled to the speaker 18. A portion of the AC signal and substantially all of the DC signal present at the electrode junction 5 constitutes the feedback signal. The ratio between the AC output signal coupled to the speaker and the feedback AC signal is dependent upon the ratio between the impedance of the voltage divided network and the impedance of the coupling network.

Turning now to my invention, which concerns itself with a simplified and improved direct coupling network for an amplifier, attention is directed to FIG. 2. This invention, as depicted in FIGURE 2, includes a coupling network which only requires a single capacitor as contrasted to similar coupling networks known in the prior art wherein at least two capacitors have been necessary. A capacitor 26 is connected between the output terminal 21 and the ground junction 22; and the feedback network 23 is connected between the output terminal 21 and the electrode junction 5. This capacitor 26 then performs the function of both the capacitor 19 and the capacitor 25. A major portion of the AC output signal passes through the speaker 18 and the capacitor 26 to ground. Substantially all the DC signal and a portion of the AC signal at the electrode junction 5 are blocked from this path; however, there is a feedback path through the network 23 to the network 17 for the DC signal and the portion of the AC signal which comprise the feedback signal.

As noted above, this amplifier circuit is one with which my invention may be advantageously employed. Similar push-pull output characteristics can be obtained with other amplifiers which are well-known in the art. Such amplifiers include single-ended push-pull amplifiers, amplifiers wherein a NPN type transistor is substituted for transistor 6 and a PNP type transistor is substituted for transistor 1 in a complementary symmetry circuit. My invention also may be effectively utilized with any other amplifier using semi-conductive devices in series. The electrode junction, constituted by the connection of two semi-conductive device electrodes, is connected to one side of the load while the other side of the load is connected to one side of the grounded capacitor. The feedback network is connected to the junction formed by the speaker and the capacitor.

It will thus be seen that my invention sets forth an improved coupling network wherein the coupling capacitor and the bypass capacitor required in the prior art have been effectively combined. To achieve this beneficial effect, my new and improved coupling network comprises merely a single capacitor between the speaker and ground in any amplifier which utilizes two semi-conductive devices connected in series.

While the present invention has been described with reference to a particular amplifier arrangement, it will be understood that various modifications may be made by those skilled in the art without actually departing from the scope of the invention. Therefore, the appended claims are intended to cover all such equivalent variations as come within the true spirit and scope of the invention.

What is claimed as new and desired to be secured by Letters Patent of the United States is:

1. In an amplifier including first and second semi-conductive devices, each of said semi-conductive devices having a first, a second and a third electrode, an AC signal-producing means, means to connect said first electrodes to said signal-producing means to control the conduction of the semi-conductive devices, means including a ground connection to bias the semi-conductive devices, means to connect said second electrodes to said biasing means, the semi-conductive devices being disposed in series across said biasing means by connecting said third electrodes together, the connection of said third electrodes constituting an electrode junction, and a load for the amplifier, the improvement comprising a coupling network, said coupling network including means to connect one side of the load to said electrode junction, a capacitive impedance connected between the other side of the load and said ground connection, a second junction constituted by the connection of the capacitive impedance to the load, and means to provide feedback connected to said second junction, to said signal producing means, and to said electrode junction, whereby said capacitive impedance isolates substantially all the direct current from said ground connection to provide direct current feedback to said signal-producing means while bypassing most of the AC signal through the load device to ground.

2. In an amplifier circuit which includes a first and a second semi-conductive device, each of the semi-conductive devices having a base, a collector and an emitter electrode, means including a ground connection to bias the semi-conductive devices, first semi-conductive device electrodes connected to said bias means, an AC signal-producing means, means for connecting said base electrodes to said signal producing means to control conduction of the semi-conductive devices, third semi-conductive device electrodes connected together to constitute an electrode junction, a feedback network, and a load, the improvement comprising a coupling network, said coupling network including a means to connect one side of the load to said electrode junction, a capacitive impedance connected between the other side of the load and said ground connection, a second junction constituted by said capacitive impedance and said load connection, and the feedback network connected to said electrode junction, to said signal producing means, and to said second junction whereby said capacitive impedance isolates substantially all the direct current at said electrode junction to provide direct current feedback to said signal-producing means while bypassing most of the AC signal through the load.

3. In an amplifier circuit including a first NPN transistor and a second PNP transistor, each of the transistors having a base, a collector and an emitter, said emitters being connected together to form an electrode junction, means including a ground connection to bias the transistors, one of the collectors connected to said ground connection, an AC signal-producing means connected to said transistor bases to control the conduction thereof, a feedback network, and a speaker; the improvement comprising a coupling network, said coupling network including a connection between one side of the speaker and said electrode junction, a capacitor connected between the speaker and said ground connection forming a second junction between said capacitor and the other side of the speaker, the feedback network connected from said electrode junction to said second junction to constitute a voltage divider therebetween, and means to connect said voltage divider to said signal-producing means, said capacitor isolating substantially all the direct current signal at said electrode junction from a path including the speaker and the ground connection and providing a feedback loop for the direct current signal.

4. In an amplifier including first and second semi-conductive devices, each of said semi-conductive devices having three electrodes one of which is a control electrode, an AC signal-producing means, means to connect said control electrodes to said signal-producing means to control the conduction of the semi-conductive devices, means including a ground connection to bias the semi-conductive devices, means for connecting the semi-conductive devices in series across said biasing means including a junction between one electrode of each of said devices, and a load for the amplifier, the improvement comprising a coupling network, said coupling network including means to connect one side of the load to said electrode junction, a capacitive impedance connected between the other side of the load and said ground connection, a second junction constituted by the connection of the capacitive impedance to the load, and means to provide feedback connected to said second junction, to said signal producing means, and to said electrode junction, whereby said capacitive impedance isolates substantially all the direct current from said ground connection to provide direct current feedback to said signal-producing means while bypassing most of the AC signal through the load device to ground.

5. In an amplifier circuit including first and second transistors of the same conductivity type, each of the transistors having a base, a collector and an emitter, the collector of the first transistor being connected to the emitter of the second transistor to form an electrode junction, means including a ground connection to bias the transistors, the emitter of the first transistor being connected to said ground connection, an AC signal-producing means connected to said transistor bases to control the conduction thereof, a feedback network, and a speaker; the improvement comprising a coupling network, said coupling network including a connection between one side of the speaker and said electrode junction, a capacitor connected between the speaker and said ground connection forming a second junction between said capacitor and the other side of the speaker, the feedback network connected from said electrode junction to said second junction to constitute a voltage divider therebetween, and means to connect said voltage divider to said signal producing means, said capacitor isolating substantially all the direct current signal at said electrode junction from a path including the speaker and the ground connection and providing a feedback loop for the direct current signal.

References Cited

UNITED STATES PATENTS

| | | | |
|---|---|---|---|
| 3,284,719 | 11/1966 | Kahn | 330—26 |
| 3,260,950 | 7/1966 | Saari | 330—97 |
| 2,885,498 | 5/1959 | Bruck | 330—25 |
| 2,847,519 | 8/1958 | Aronson | 330—25 |

KATHLEEN H. CLAFFY, *Primary Examiner.*

R. P. TAYLOR, *Assistant Examiner.*